United States Patent [19]

Heichler et al.

[11] Patent Number: 5,029,331
[45] Date of Patent: Jul. 2, 1991

[54] METHOD FOR EDITING A CONVOLUTIONAL CODE FOR TRANSMISSION AND ITS RECONVERSION AT THE RECEIVER AS WELL AS A DEVICE THEREFOR

[75] Inventors: Johannes Heichler, Murrhardt; Peter Enders, Backnang, both of Fed. Rep. of Germany

[73] Assignee: Ant Nachrichtentechnik GmbH, Backnang, Fed. Rep. of Germany

[21] Appl. No.: 223,946

[22] Filed: Jul. 25, 1988

[30] Foreign Application Priority Data

Jul. 25, 1987 [DE] Fed. Rep. of Germany ....... 3724729

[51] Int. Cl.$^5$ .......................................... H03M 13/12
[52] U.S. Cl. ................................................... 371/43
[58] Field of Search ........................ 371/43, 44, 45, 46

[56] References Cited

U.S. PATENT DOCUMENTS 4,462,101  7/1984  Yasuda et al. ......................... 371/43
4,805,174  2/1989  Kubota et al. ......................... 371/43

FOREIGN PATENT DOCUMENTS 36009059  7/1987  Fed. Rep. of Germany .

OTHER PUBLICATIONS

Yasuda et al., Dev't of Variable-Rate Viterbi Decoder & Its Perf. Characteristics (pp. XII/24-31), "Conf. Proc. 6th Inter. Conf. Satellite Com.", Phoenix, Ariz., Sept., 1983.

Forney, Jr., "The Viterbi Algorithm", Proc. of IEEE, Mar., 1973.

Cain et al., "Punctured Convolutional Codes of Rate (n − 1)/n & Simp. Max. Likelihood Decoding", IEEE Transactions on Info. Thoery, Jan., 1979 (pp. 97-100).

Yasuda et al., "High Rate Punctured Convolutional Codes for Soft Dec. Viterbi Decoding", IEEE Transactions on Comm., Mar., 1984, (pp. 315-319), vol. COM-32, #3.

Primary Examiner—Stephen M. Baker
Attorney, Agent, or Firm—Spencer & Frank

[57] ABSTRACT

A method and apparatus for editing a high-convolutional code for transmisison and its reconversion at a receiver using code puncturing n-output bit streams of a convolutional encoder. The device includes parallel switched data rearrangers at the transmitter provided with control switching circuits which evenly distribute bit streams to the transmission channels. At the receiver, a de-puncturer processes all transmission channels in parallel, downstream of which dummy bits are inserted by a multiplexer and a convolutional decoder subsequently decodes the received data.

25 Claims, 10 Drawing Sheets

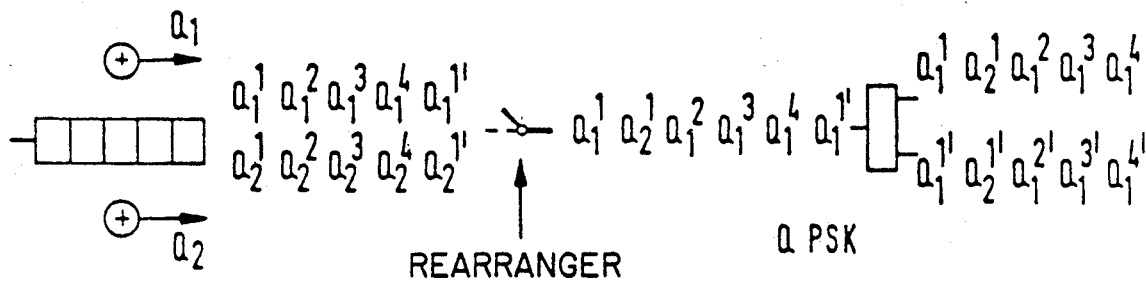
FIG. 4
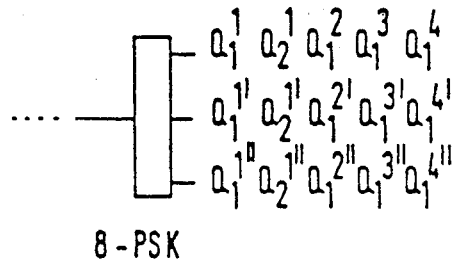
FIG. 5
PRIOR ART
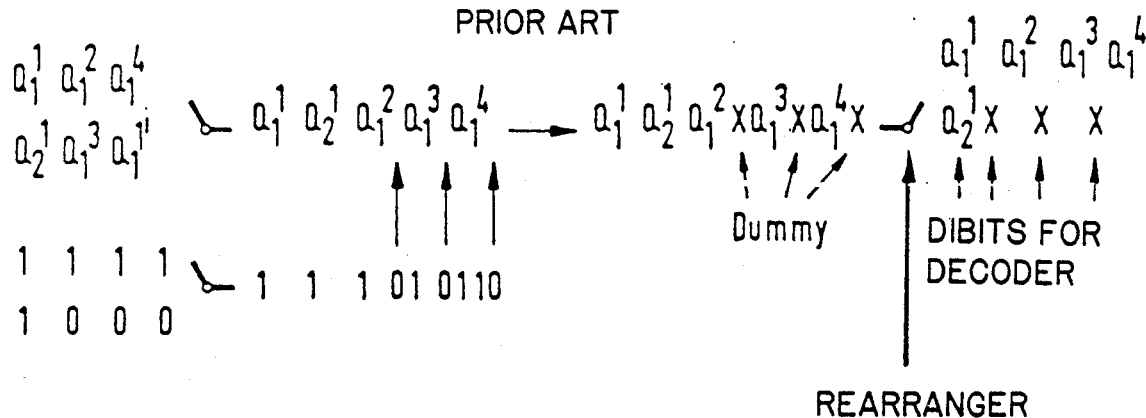
FIG. 6
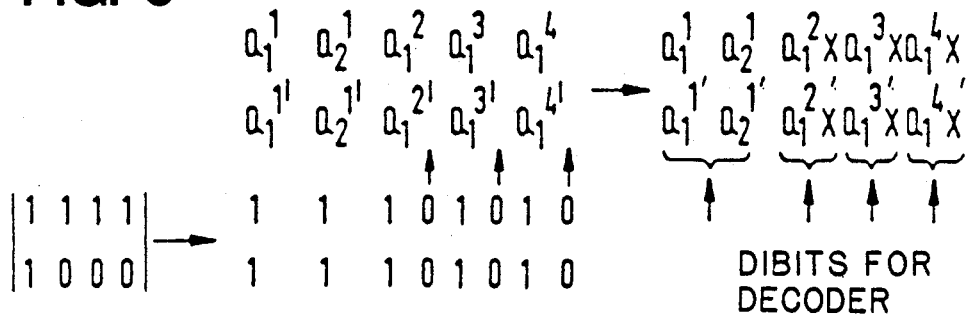

FIG. 16  FIG. 17
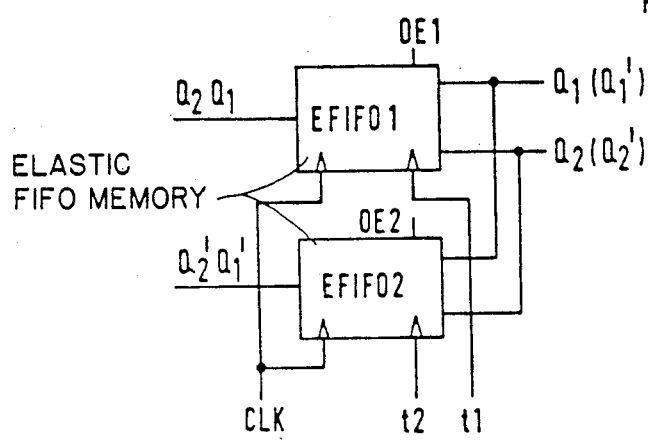
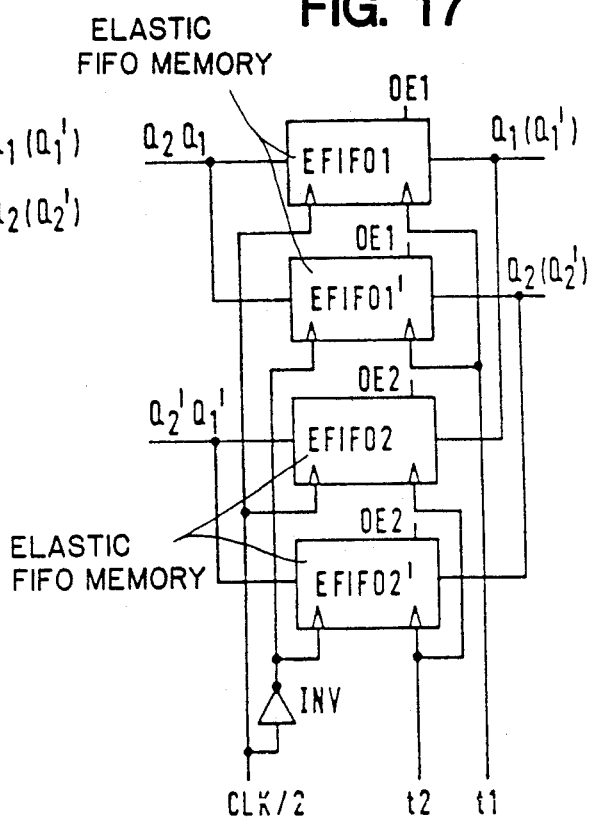
FIG. 18
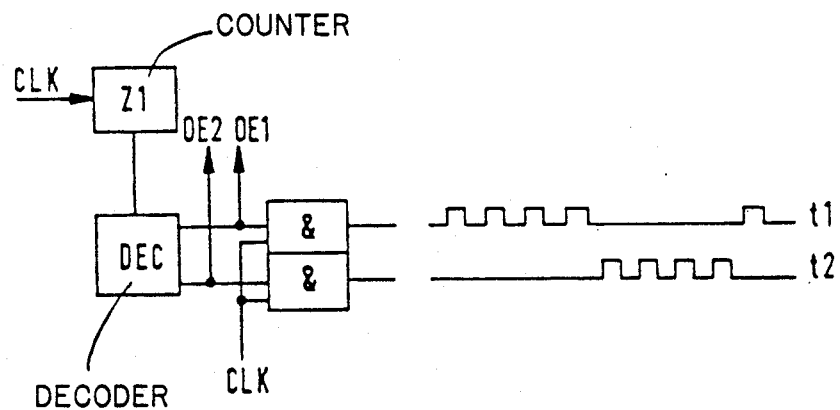

METHOD FOR EDITING A CONVOLUTIONAL CODE FOR TRANSMISSION AND ITS RECONVERSION AT THE RECEIVER AS WELL AS A DEVICE THEREFOR

BACKGROUND OF THE INVENTION

The invention relates to a method for editing a high-rate convolutional code for transmission and its reconversion at the receiver using code puncturing and serially adding the n-output bit streams (n=2, 3, ...) of a convolutional encoder. Such a method is known from "Conference Proceedings of the 6th International Conference on Digital Satellite Communications", Phoenix, Ariz., USA, September 1983, p. XII/24-31, for use in digital satellite communications.

High-rate convolutional codes can be generated basically in two ways:
 a. by use of a high-rate encoder, and
 b. by application of punctured coding to a low-rate code.

In punctured coding, single bits are deleted at intervals in a low-rate convolutional code. FIG. 1 shows the principle of such punctured coding. The source bits I are written into the register Reg of the encoder; see FIG. 2. The output bit streams $Q_1$ and $Q_2$ of the encoders are received by adders which link the parallel outputs of the register cells. A puncturing coder or puncturer Pu, which can be described by a puncturing algorithm, suppresses those bits for which the algorithm contains a 0 and transmits those bits for which the algorithm contains a 1. If every fourth bit is deleted from a code with the rate $\frac{1}{2}$, a code of the rate $\frac{1}{2} \cdot 4/3 = \frac{2}{3}$ is created (FIG. 1).

Punctured codes can be decoded the same as the originally non-punctured code of the rate $1/n$, and may permit a selection of two (instead of $2^{n-1}$) possible paths for each state. At the receiver, a de-puncturer for a punctured code is provided ahead of the decoder, by means of which so-called "dummy bits" are inserted in place of the previously deleted bits, which do not influence the metric calculation (See page XII/25, first column in the previously cited publication).

It is known from "IEEE Transactions on Communications", Vol. COM-32, No. 3, March 1984, pp. 315-319, to derive higher rate convolutional codes by puncturing from a code of a rate of $\frac{1}{2}$. The higher rate may be varied or selectively used by selectively varying the puncture rate and/or selectively puncturing the code, according to propagation conditions.

SUMMARY OF THE INVENTION

It is an object of the invention to develop a method and device for performing the method, by which creating a high-rate convolutional code for transmission and its reconversion at the receiver using code puncturing and serially combining the n-output bit streams (n=2, 3, ...) of a convolutional encoder makes it easier to perform phase error correction at the receiver. The object in regard to the method is attained by providing that for transmission of each the serially combined n-output bit streams of an encoder output period are distributed to n transmission channels such that the length of the period (channel period) during which data is distributed to a particular transmission channel is the same for all transmission channels, in that only such data are distributed to each transmission channel per channel period that originate from the same time interval of the encoder output period determined by the length of the channel period, and in that the de-puncturing at the receiver is performed in parallel and simultaneously for all channels. The object in regard to the device is attained by providing that the n outputs of a convolutional encoder are each connected to n parallel inputs of n parallel switched data rearrangers at the transmitter, that to such data rearrangers control switching circuits are assigned in such a way that data from a bit stream regarding a length of period can be alternately read in and continuously read out, that means are provided for each transmission channel for parallel/serial conversion, that a puncturer, processing all n transmission channels in parallel, is provided downstream from the means for parallel/serial conversion, that at the receiver a de-puncturer, processing all transmission channels in parallel, is provided, which at the output is equipped with a multiplexer for inserting metric-neutral filler data (dummy bits), that at the receiver data rearrangers are provided having control switching circuits for the continuous read-in and alternate read-out of the transmitted data in regard to the length of a period, and that downstream from the data rearrangers at the receiver a convolutional decoder corresponding to the convolutional encoder is disposed.

The method and the device in accordance with the invention have the following advantages:

Higher processing speeds can be attained because of parallel processing during the puncturing and the de-puncturing. The delay time between the phase error correction and the metric calculation in the decoder can be shortened by means of the data rearrangement according to the invention, thus reducing the synchronization time. Such changes in the code rate are often required if the transmission quality distance (e.g. for satellite links) worsens. Since all n transmission channels show the same lengths of period because of the distribution in accordance with the invention, an improved synchronization error correction becomes possible. The puncturing pattern as a whole is maintained since the data are always grouped in the same time intervals per channel. This also results in an improved possibility to correct phase errors as opposed to the realization according to the "6th International Satellite Communications Proceedings", where the distribution of the transmission data to the channels is arbitrary. Using the method according to the invention, an order structure results which is tailored to the PSK transmission and thus permits simple error correction. Doubtful phase errors (phase ambiguity) can be corrected by simple channel changes.

BRIEF DESCRIPTION OF THE DRAWINGS

These and other features and advantage of the invention will be more completely understood from the following detailed description of the preferred embodiments with reference to the drawings in which:

FIG. 4 shows the bit streams at the transmitter in the method of the invention,
FIG. 5 shows de-puncturing in accordance with the prior art,
FIG. 6 shows de-puncturing according to the invention,
FIG. 16 is a data rearranger at the receiver,
FIG. 17 is a further data rearranger at the receiver,
FIG. 18 shows the generation of the reading clock rates for the data rearranger at the receiver.

DESCRIPTION OF THE PREFERRED EMBODIMENTS

Figure 2:
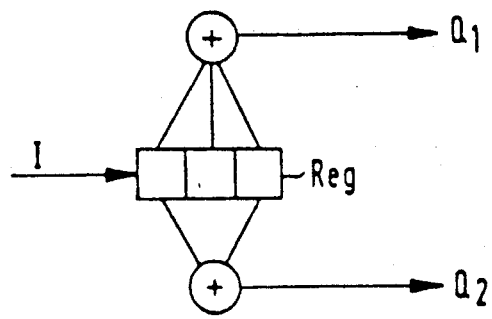
FIG. 2 shows the input and output of an encoder.
Figure 1:
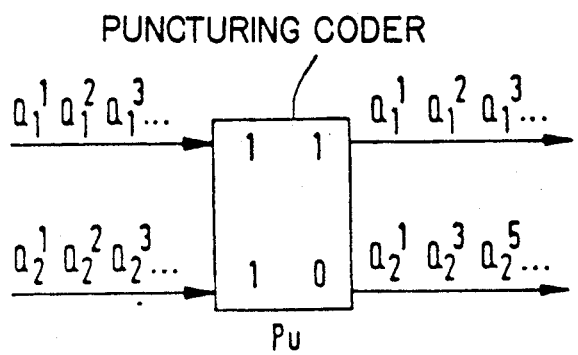
FIG. 1 illustrates the principle of punctured coding.
Figure 3:
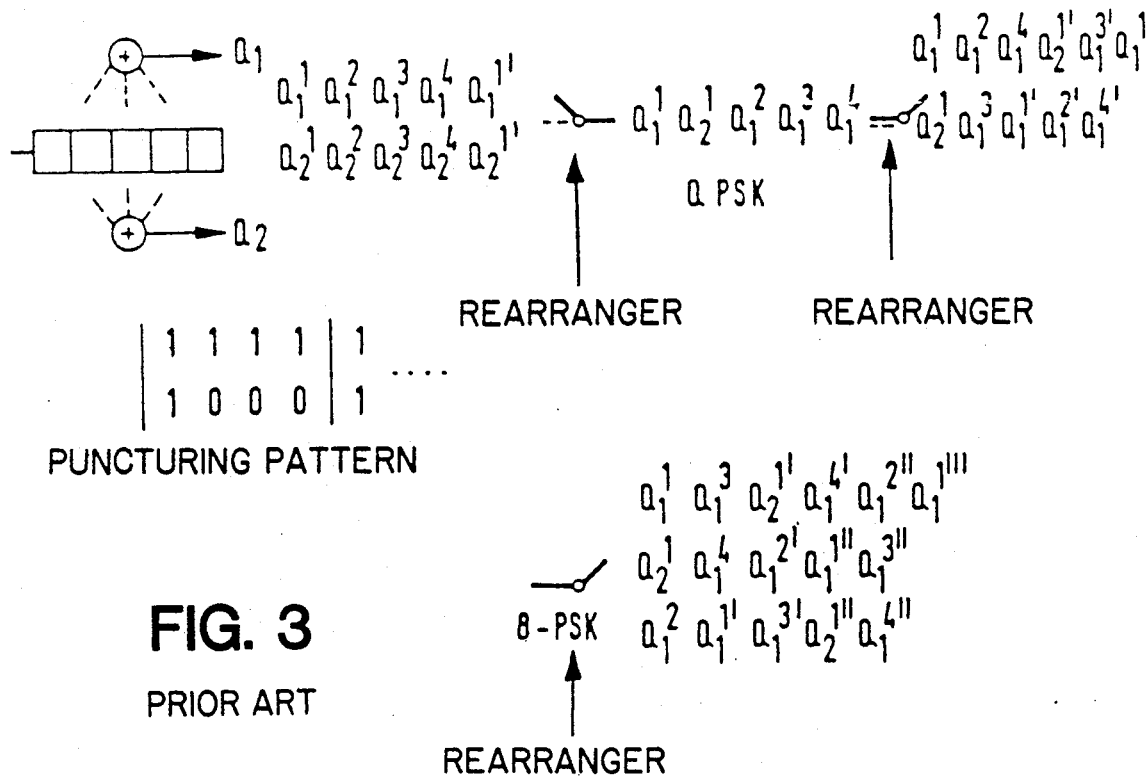
FIG. 3 shows the bit streams at the transmitter in a customary transmission.

During transmission with a convolutional code with the rate $R = 4/5$, punctured from a code with the rate $R = \frac{1}{2}$, the result is the uneven data distribution to the two channels shown in FIG. 3, if the output bit streams $Q_1$ and $Q_2$ per period of the encoder are first serialized, keeping in mind the puncturing pattern (deleting map) shown in the FIG—$Q_1^1 Q_2^1 Q_1^2 Q_1^3 Q_1^4$—and then are parallelized for transmission as shown FIG. 3 shows in the top row the distribution of the data for QPSK transmission and in the bottom row the distribution for 8-PSK (only the output is shown for 8-PSK). In the method of the invention, serialization (serial combining) also takes place; however, no parallelization as in FIG. 3 takes place but, because of the parallel processing, the second channel receives the identically constructed period from the following time interval $(Q_x')$. FIG. 4 shows the bit streams at the input and output during processing according to the invention. During QPSK transmission the upper channel receives only source bits without a prime, i.e. all source bits to the upper channel originate in a given time interval of an encoder output period, determined by the length of channel period during which the unprimed source bits are distributed. The number of bits output to each channel during a channel period corresponds to the number of "1"'s in the puncturing pattern. "Encoder output period" here means the period during which all unprimed and singly primed source bits are output by the convolutional encoder, and corresponds to the number of elements in the puncturing pattern (eight in this embodiment) multiplied by the number of channels. For 8-PSK, this period would additionally include that for outputting the doubly primed source bits. The lower channel contains only primed source bits all originating in the succeeding time interval. The same amount of source bits always reaches each channel; there is even distribution. The corresponding conditions during 8-PSK transmission are shown below this. All channels contain the same pattern of source bits. (This is reflected by the same subscripts and superscripts in the bits shown in each channel in FIG. 4). The customary de-puncturing pertaining to FIG. 3 at the receiver is shown in FIG. 5. Since there is no even distribution of the bits in relation to the channels, more bits neutral "dummy bits X"—have to be inserted into one channel than into the other channel and at different times. Serial combining and parallelization have to be performed again in order to generate dibits for the decoder. Serial combining and parallelization are required to obtain an order with equally distributed bit streams on the QPSK channel.

Contrary to this, in the method according to the invention the data streams are evenly distributed in regard to the channels and are identically constructed. Thus, de-puncturing can be performed in parallel and simultaneously for all channels as illustrated in FIG. 6.

Figure 7:
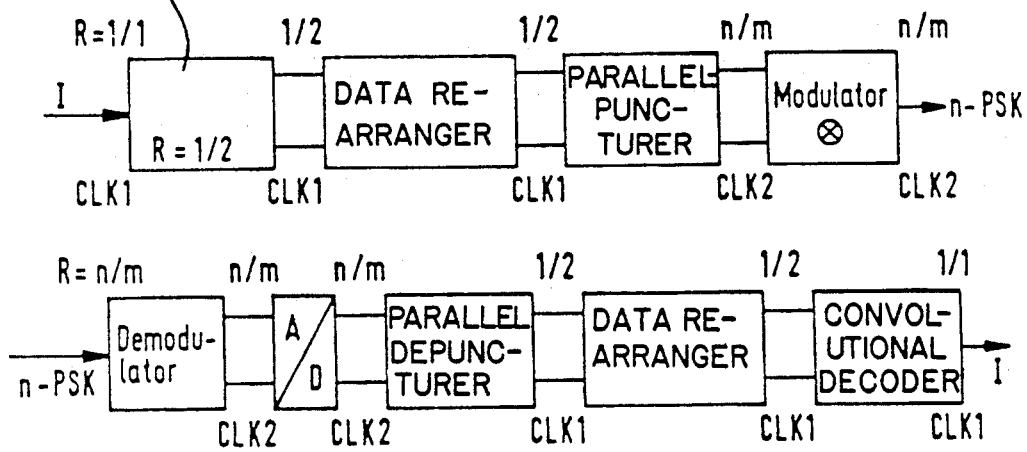
FIG. 7 is a general view of a device for practicing a method in accordance with the invention.

FIG. 7 is a general view of a device for practicing a method in accordance with the invention. The source bit stream I is supplied to a convolutional encoder. A data rearranger at the transmitter, downstream of which a parallel puncturer is placed, follows the convolutional encoder. A modulator for the processing of an n-PSK signal to be transmitted (e.g. as by phase modulation) receives the output data streams of the parallel puncturer. At the receiver a demodulator for demodulating the n-PSK signal is provided, followed by an analog/digital converter. Downstream of the latter are a parallel depuncturer and a data rearranger at the receiver. A subsequent convolutional decoder, e.g. a Viterbi decoder, is used to re-form the data in accordance with the source data entered at the transmitter. In FIG. 7 the code rate n/m is indicated before each processing stage, as well as the clock rate CLK1 or CLK2.

The processing stages of the encoder, decoder, modulator, demodulator and A/D converter are not further addressed below, since they can be realized by known standard circuits. In this connection see, for example, the following publications: NTC, Vol. 3, 1981, E. 1.7.1-E. 1.7.4. and Conference Proceedings of the 7th International Conference on Digital Satellite Communications, Munich, 1986, pp. 361-367.

Figure 10:
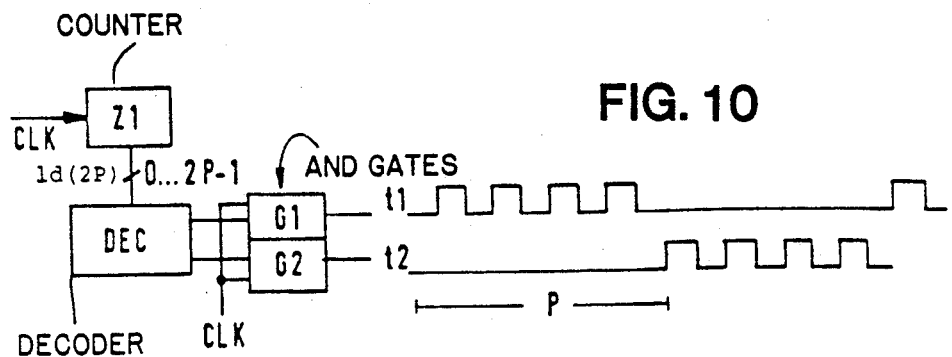
FIG. 10 shows the generation of the writing clock rates for the data rearrangers according to FIGS. 8 and 9.

The remaining processing stages will now be described. The data rearranger at the transmitter will be described by means of FIGS. 8 and 9 by the example of a data rate of $R = \frac{1}{2}$. The source data entered into the register cells of the encoder ENC at the clock rate CLK are, as already explained, linked via adders. The output signals of the adders are supplied in parallel to two elastic FIFO memories SFIFO1 and SFIFO2. The encoder output signals for the full period of P bits each can be alternately read into these memories at their writing clock rates t1 or t2. Read-out of the data takes place continuously at common read clock rate CLK. In this way the desired offset in time is achieved. In the exemplary embodiment in accordance with FIG. 8 the memories SFIF01 and SFIF02 are provided as parallel-serial converters. Therefore they each have only one data output. In the exemplary embodiment according to FIG. 9, the memories SFIF01 and SFIF02 are provided as parallel-parallel converters. The two output bit streams each per memory are guided across a downstream multiplexer MX1 or MX2 as means for parallel-serial conversion. The write clock rates for the respective memories are, as in the exemplary embodiment according to FIG. 8, according to the clock rates t1 and t2. However, the common read clock rate is only CLK/2, contrary to the exemplary embodiment according to FIG. 8. Clock rate CLK/2 also serves as the control signal for the stepping of the multiplexers MX1 and MX2. Similarly constructed control switching circuits for the generation of the write clock rates t1 and t2 are associated with the data rearrangers according to FIGS. 8 and 9 (FIG. 10). These control switching circuits consist of a counter Z1 for counting of the pulses of the clock rate CLK supplied by a generator. The output of the counter Z1 is connected via a decoder DEC with two AND gates G1, G2, arranged in parallel. The clock pulses are also supplied to these AND gates. The write clock rate t1 appears at the output of the AND gate G1 during the first period with the length of P bits (the puncturing code length) and the write clock rate t2 during the second period with the length of P bits a well. The advantage of this data rearrangement in accordance with the invention lies in that, although the data are serially converted in the respective channels, no faster clock rates than the information bit rate can appear. Therefore, this constitutes very fast, genuine parallel processing. Furthermore, the method is flexible. A change to a source code of the rate 1/n only means that the elastic memories have n, instead of two, parallel inputs. Changing to an n-channel transmission system means that instead of two, n elastic memories are used in parallel.

Figure 11:
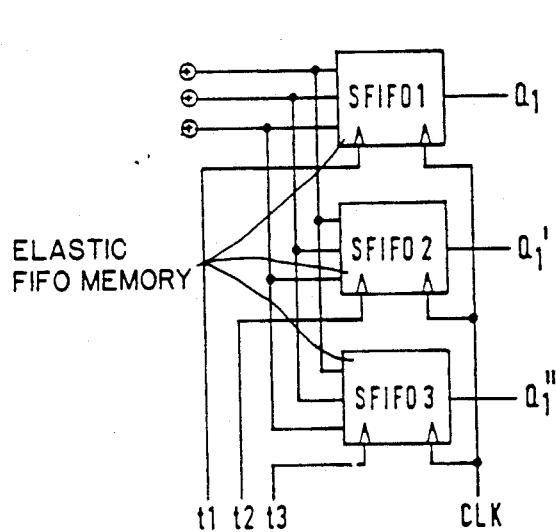
FIG. 11 shows a data rearranger at the transmitter for the rate $R = \frac{1}{2}$.
Figure 12:
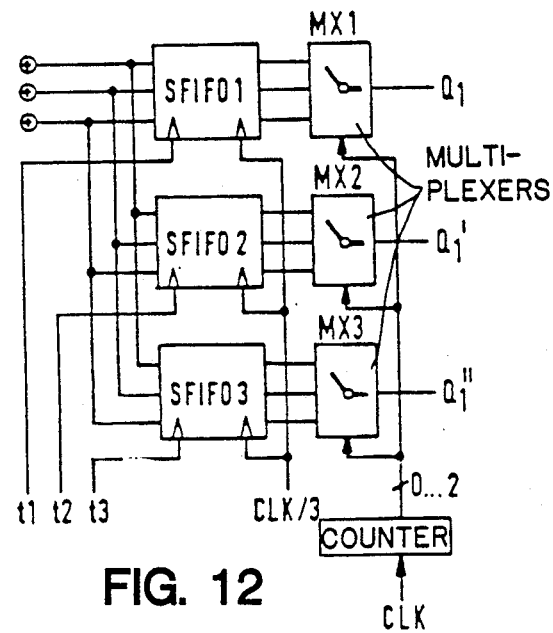
FIG. 12 shows a further data rearranger at the transmitter for the rate $R = \frac{1}{2}$.
Figure 13:
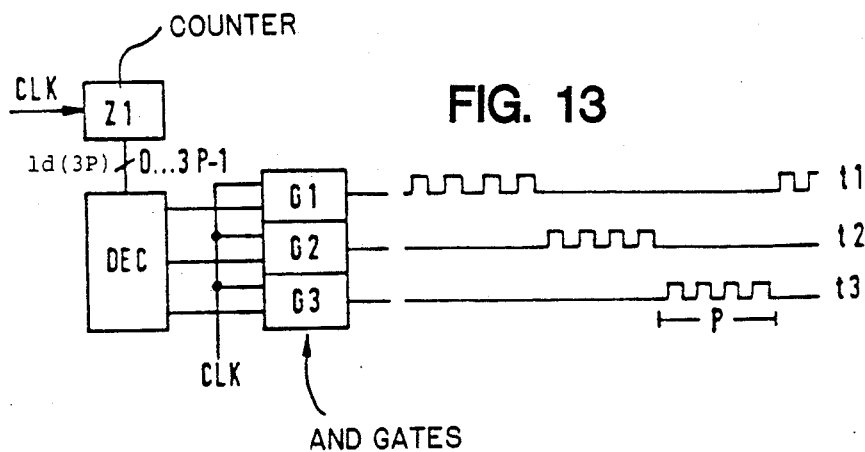
FIG. 13 shows the generation of the writing clock rates for the data rearrangers according to FIGS. 11 and 12.

FIGS. 11 to 13 show as examples data rearrangers with the associated control switching circuits for a code of the rate of R=$\frac{1}{3}$ and 8-PSK modulation. In connection with the data rearrangers in accordance with FIGS. 11 and 12, three elastic FIFO memories SFIFO1, SFIF02, SFIF03 are working in parallel In FIG. 11 these memories are provided, as in FIG. 8, as parallel-serial converters and in FIG. 12 as parallel-parallel converters with succeeding multiplexers MX1, MX2, MX3 for parallel-serial conversion. The write clock rates t1, t2, t3 are generated by control switching circuits which correspond to those in FIG. 13, i.e. decoder DEC, which may be a ROM, a multiplexer or a multiplexer array, now with three outputs and three succeeding and parallel acting AND gates G1, G2 and G3. Write clock rates t1, t2, t3, each offset by one length of period P (P bits), are the result. The read clock rate in FIG. 11 again is CLK and in FIG. 12 CLK/3.

Counter Z1 must supply P.q states to the decoder DEC, P being the number of bits in a puncturing pattern and q being the number of timing offsets necessary to perform the function performed by the circuitry of FIGS. 11 and 12. In the example of FIG. 10, the number q of timing offsets is 2 and in the example of FIG. 13, the number of timing offsets is 3. Therefore, counter Z1 has 1d (P.q) binary output lines where 1d represents logarithm for the base 2.

Puncturing and de-puncturing takes places simultaneously in all channels. Here, too, the fastest clock rate is the information bit rate. In contrast to the customary serial process, in the invention the greater capacity of 4- or 8-PSK systems can be converted into a gain in speed because of parallel processing.

Figures 8, 9:
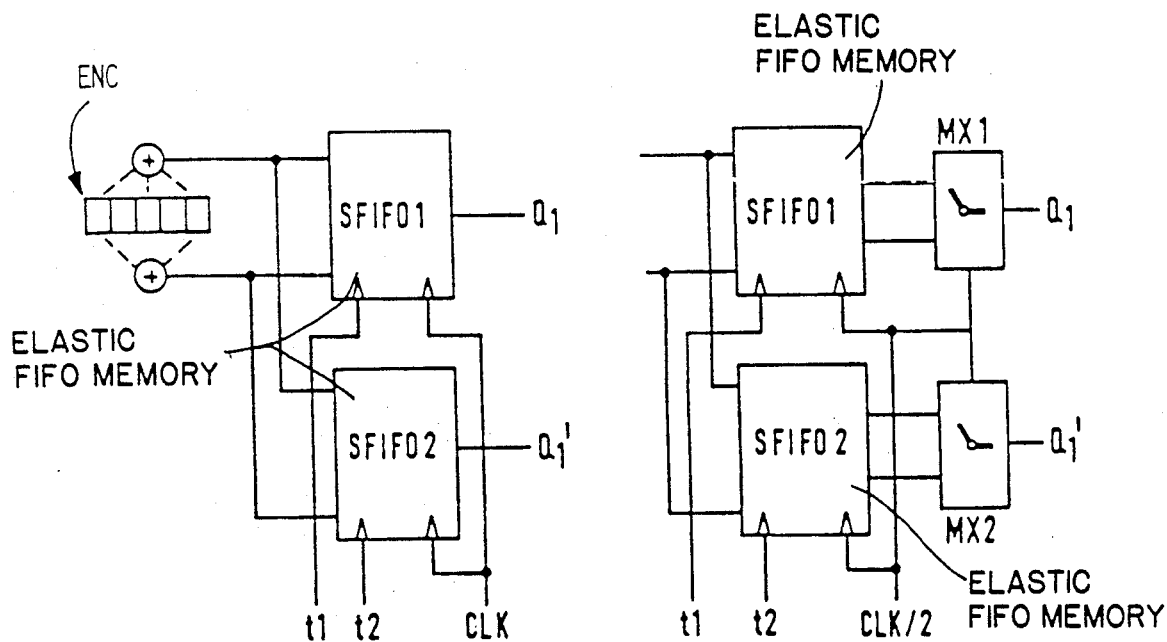
FIG. 8 is a data rearranger at the transmitter.
FIG. 9 is a further data rearranger at the transmitter.
Figure 14:
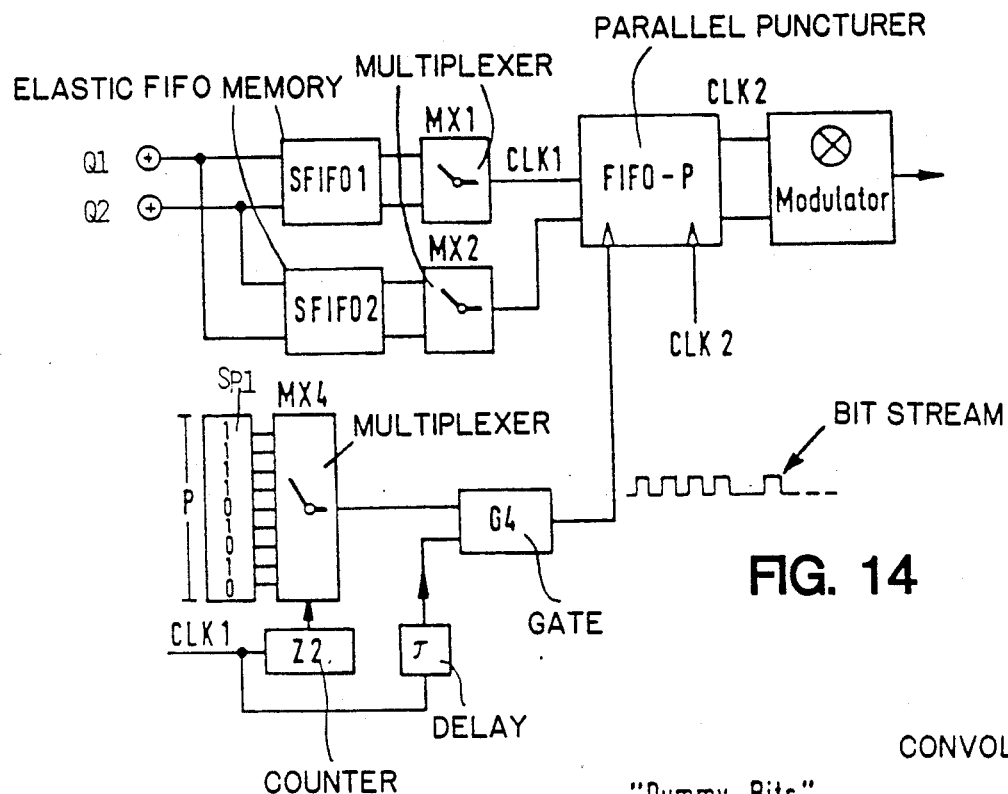
FIG. 14 shows the principle of a parallel puncturer.

FIG. 14 illustrates the principle of a parallel puncturer FIFO-P, upstream of which is arranged the data rearranger in accordance with FIG. 9, for example. A commercially available switching circuit, for example a TDC 1030 of the firm TRW, can be used as parallel puncturer FIFO-P. A write clock rate is supplied having an interruptor for the bits to be deleted, i.e., punctured. This write clock rate interruption is achieved by means of an AND gate G4, which is supplied with a continuous clock rate CLK1 as well as with the output signal of a multiplexer MX4. This multiplexer MX4 switches the puncturing pattern (deleting map), stored in a memory Sp1 and having the width P bits, to the gate G4. As soon as the multiplexer MX4 switches a 0 from the deleting map to the gate G4, the write clock rate is interrupted. The stepping of the multiplexer MX4 is controlled via a counter Z2 by the clock rate CLK1. For the suppression of spikes the gate G4 is not directly actuated by the clock rate CLK1, but by a clock rate somewhat delayed (by time delay $\tau$) by a delay member, which takes into account the switching times of the multiplexer MX4. The read clock rate CLK2 for the parallel puncturer is continuous. The basic function of the puncturer is similar to that in FIG. 5, p. XII-26, Conference Proceedings of the 6th International Conference on Digital Satellite Communications; however, processing is parallel and therefore twice the data transfer rate can be achieved with the same clock rate.

Figure 15:
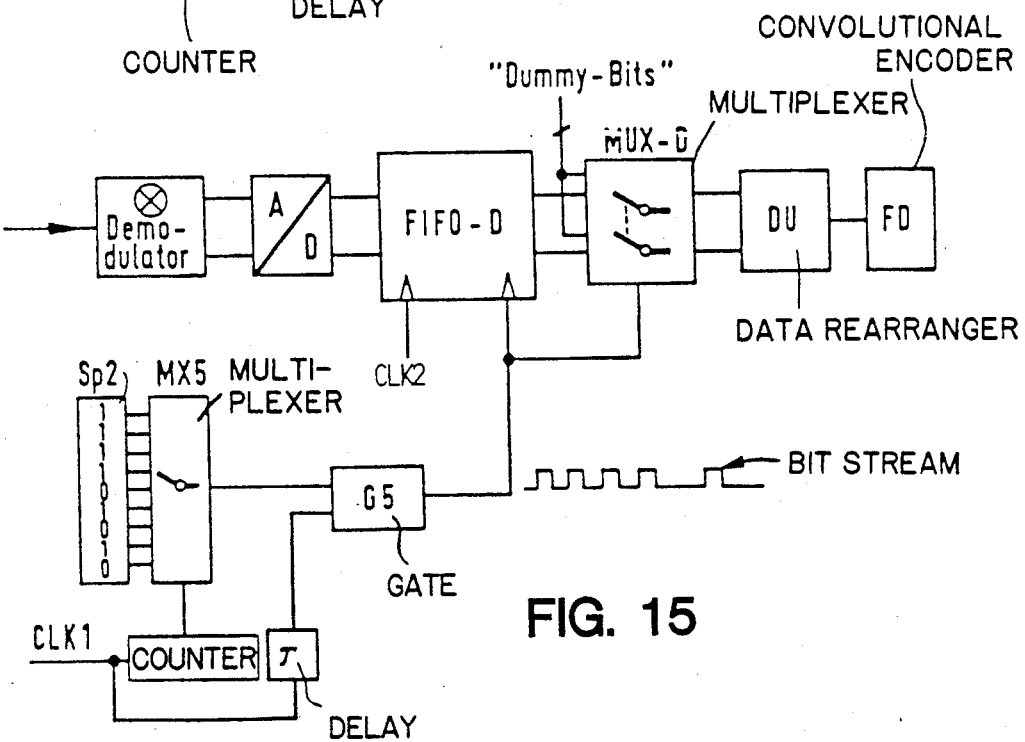
FIG. 15 shows the principle of a parallel de-puncturer.

The de-puncturer at the receiver FIFO-D is shown in FIG. 15. The data received and modulated by means of a demodulator are A/D converted and supplied to the input of the elastic memory FIFO-D. The de-puncturer at the receiver is constructed analogously to the puncturer at the transmitter, i.e. also processing in parallel. However, in the puncturer the FIFO write clock rate is interrupted while th read clock rate is continuous, while in the de-puncturer the FIFO write clock rate CLK2 is continuously supplied and the read clock rate CLK1 is interrupted. Interruption of the read clock rate is realized in the same manner as the interruption of the write clock rate at the transmitter, i.e. by means of an AND gate G5, which is supplied with the continuous clock rate CLK1 as well as the output signal of a multiplexer MX5. This multiplexer MX5 switches the depuncturing pattern stored in a memory Sp2 to the gate G5. A multiplexer MUX-D is disposed downstream of the de-puncturer FIFO-D, which inserts metric-neutral filler data, or "dummy bits", e.g. data from the center of a value range of a soft decision decoding, into the read-in breaks of the FIFO-D. A data rearranger DU at the receiver and a convolutional decoder FD follow the multiplexer MUX-D. Different embodiments for such a data rearranger at the receiver are described below. Data rearrangers are also provided at the receiver in the same way as the data rearrangers at the transmitter. In FIGS. 16 and 17 data rearrangers at the receiver are provided which correspond in their construction to the rearrangers at the transmitter in accordance with FIGS. 8 and 9. For a data rate of R=$\frac{1}{2}$, the data rearrangers according to FIG. 16 consist of two elastic FIFO memories EFIFO1 and EFIFO2 which are embodied as serial-parallel converters. Their outputs are switched in parallel. Combinations of successive bits of different periods $Q_2 Q_1$, $Q_2' Q_1'$ are applied to their inputs. Offset in time is achieved by means of the FIFO memories, into which continuous read-in and alternate read-out is performed so that the bits of similar period-dibit combinations are applied in parallel and at the same time to the outputs of the data rearrangers. The write clock rate CLK is the same for both FIFO memories. The read clock rates t1 and t2, offset from each other, are generated, as shown in FIG. 18, with control switching circuits similar to those in FIG. 10—counter Z1, decoder DEC, AND gates &. The output signals of the decoder are applied in the form of output enable signals OE1 and OE2 to the corresponding inputs of the FIFO memories.

FIG. 17 illustrates a further data rearranger at the receiver. It works with serial FIFO memories. Serial-parallel conversion is achieved with a rate of $R=\frac{1}{2}$ by means of two FIFO memories EFIF01, EFIF01' or EFIF02, EFIF02' per channel, into which read-in takes place alternately. The write clock rate for the two FIFO memories of a channel is CLK/2 at one time and CLK/2 inverted (the CLK/2 pulses are inverted) at the other. The inverter INV is provided for the inversion of the write clock rate signal CLK/2. The FIFO memories which are supplied with the same write clock rate are interconnected at their outputs. With this the following rearrangement is realized: the successive bit combinations $Q_2 Q_1$ are split into the parallel dibit combination $Q_1$ and $Q_2$, and in the same manner the successive bit combination $Q_2' Q_1'$ of the next period are split into the dibit combination $Q_1'$ and $Q_2'$.

Figure 19:
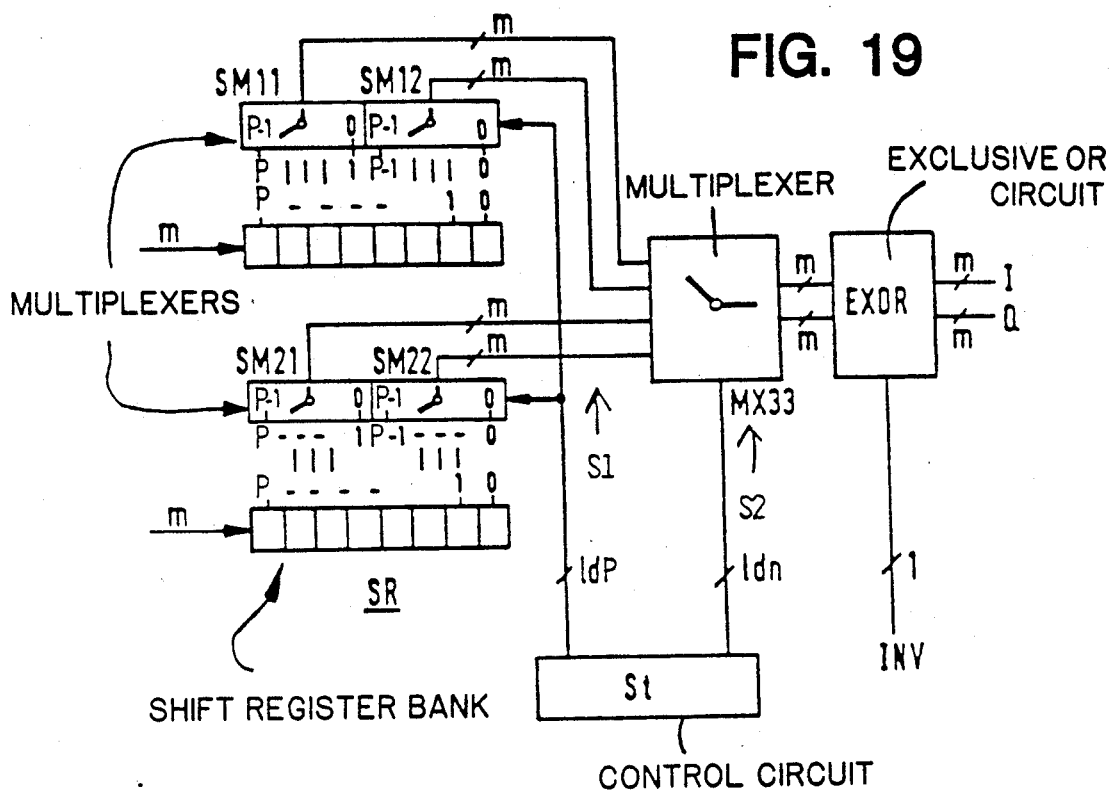
FIG. 19 shows a data rearranger at the receiver, consisting of a shift register bank.

FIG. 19 shows an alternate embodiment of the data rearranger at the receiver. Here, the data rearranger comprises a shift register bank SR, the width of which is determined by the number n (here n=2) of the channels, the soft decision word width m, and the length of which is determined by the number P of bits per period plus one. For serial-parallel conversion two multiplexers SM11, SM12, SM21, SM22 are provided for each register line, which are respectively connected with the parallel outputs of the shift register bank SR. They are controlled by a control circuit St in opposite directions and, in respect to the parallel outputs of the shift register bank SR offset by a register line.

Figure 19A:
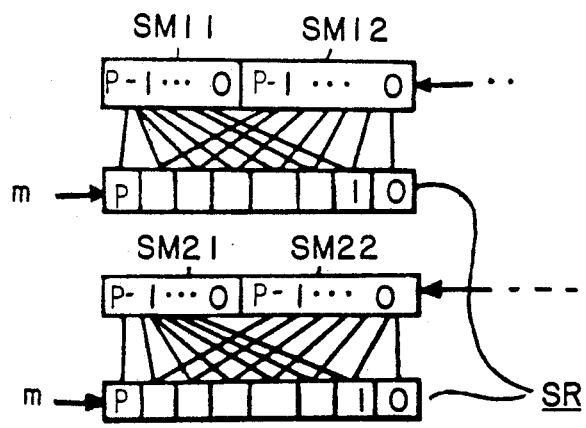
FIG. 19a shows the connections between the multiplexers and shift registers of the rearrangers of FIG. 19.

The connections between the multiplexers SM11, SM12, SM21 and SM22 and the corresponding shift registers of shift register bank SR which are illustrated in FIG. 19a are as follows:

The $P-1 \ldots, 0$ inputs of multiplexers SM11 and SM21 are connected to the respective $P, \ldots, 1$ cells of the shift registers.

The $P-1, \ldots, 0$ inputs of the multiplexers SM12 and SM22 are connected to the $P, \ldots, 1$ cells of the shift registers.

In this manner m dibits—soft decision bits—are created, so that the transmitted data are again present in the original time sequence. Thus, always two bits are read out from the shift register bank, while only one is read in. The number of control lines for the stepping of the multiplexers is ld P, where ld is the logarithm to the base of two.

When using the shift register bank in combination with the multiplexers the processing time is shortened because of the parallel action in contrast to the FIFO memories according to FIGS. 16 and 17. A further multiplexer MX33 is located at the outputs of the shift register bank S which successively switches shift register SM11, SM12, SM21 and SM22 to its output after each period. The number of the control lines for the stepping of this multiplexer MX33 is ld n.

Correction of a phase ambiguity of the n-PSK signal received is possible in the method even downstream of the de-puncturer or the data rearranger at the receiver in contrast to the customary realizations, in which the associated dibits no longer are superimposed downstream of the de-puncturer and a phase ambiguity correction can no longer be performed there by inversion and/or transposition of the channels. If the phase ambiguity correction is performed downstream from the data rearranger at the receiver, this has the advantage that no more transit times which extend the synchronization time can occur between correction and decoding.

Phase ambiguity correction is of particular importance with code puncturing. Since a periodic structure is superimposed on the code by puncturing, code synchronization is required with punctured codes. This depends on the code rate. For example, for a code with the rate 5/x, a 5-fold ambiguity must be resolved, for a code with the rate 6/x, a 6-fold, etc. If the puncturing period is increased by a factor of k, e.g. for a code of the rate (k·5)/(k·x) a k·5-fold ambiguity must be resolved.

Figure 20:
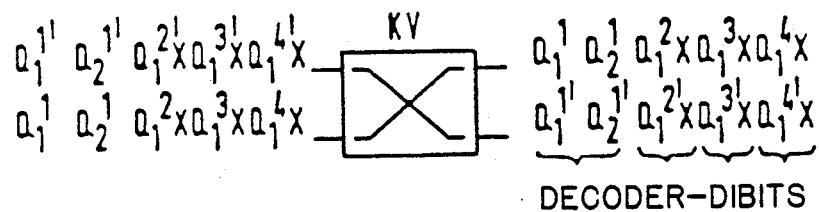
FIG. 20 shows the channel changes during phase ambiguity.

FIG. 20 illustrates the channel transposition by means of a channel transposition stage KV, if phase ambiguity occurs.

Figure 21:
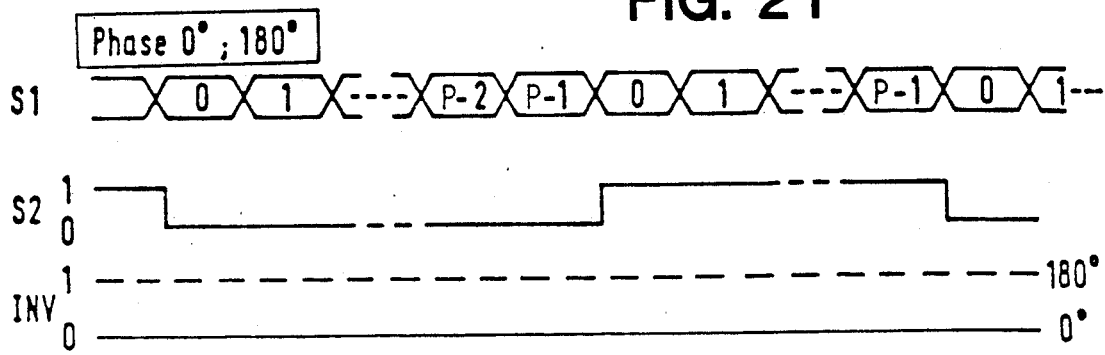
FIGS. 21 to 23 show the paths of control signals for different phase states.
Figure 22:
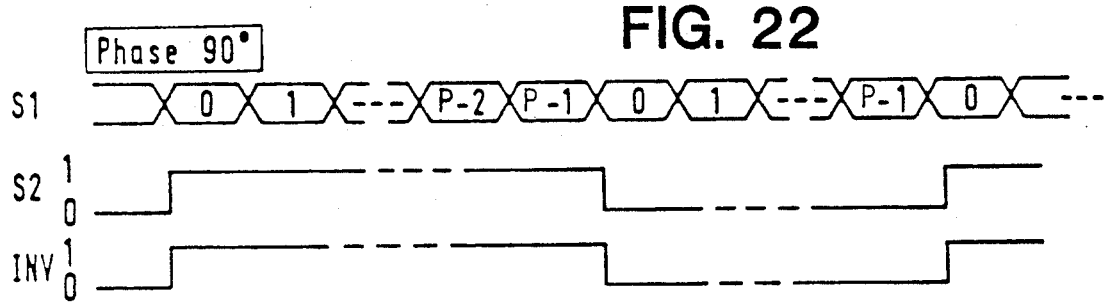
Figure 23:
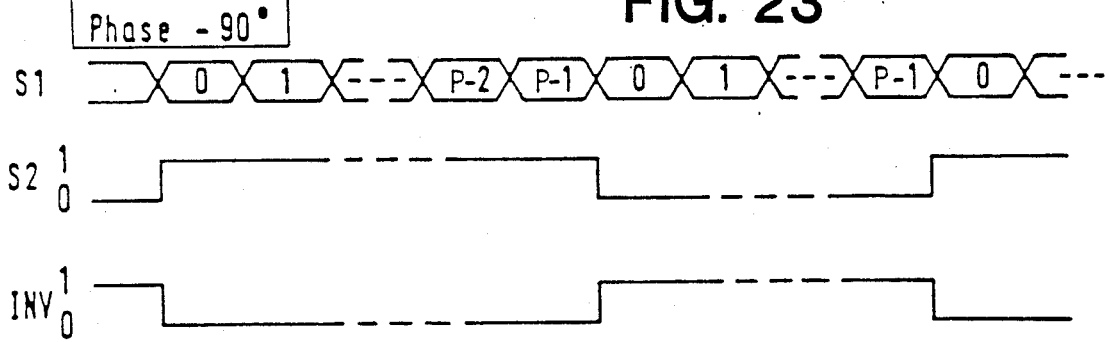

In the exemplary embodiment according to FIG. 19 a switchable inverter—exclusive OR gate—is provided for the correction of phase ambiguity, the switching of which is triggered by the control signal INV. FIGS. 21 to 23 illustrate the paths of the control signals S1, S2 and INV in connection with the different phase conditions.

Figure 24:
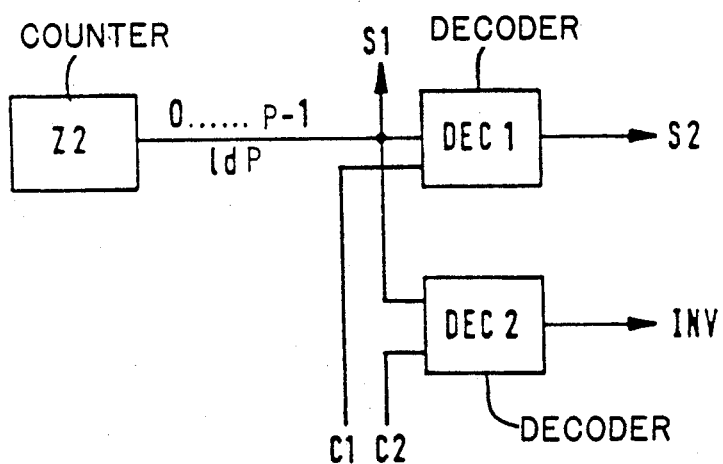
FIG. 24 shows the composition of the control stage for the control signals.

The structure of the control stage for the generation of the control signals S1, S2 and INV is illustrated in FIG. 24. It consists of a counter Z2 for counting modulo P, and of two decoders DEC1 and DEC2. The output signal of the counter Z2, i.e. ld P, and a respective control signal are supplied to these decoders.

For the decoder DEC1 this is the control signal C1 and for the decoder DEC2 the control signal C2. Phase information is contained in these control signals C1 and C2, which can be realized for QPSK for example by the following code associations:

| C1 | C2 | Phase |
|----|----|-------|
| 0  | 0  | 0°    |
| 0  | 1  | 90°   |
| 1  | 0  | 180°  |
| 1  | 1  | 270°  |

The control signals $C_1$ and $C_2$ can be derived by a suitable convolutional code signal error correcting apparatus as is described in the copending and concurrently filed application of Johannes Heichler, entitled "A METHOD AND APPARATUS FOR CORRECTING ERROR IN CONVOLUTIONAL CODE SIGNALS", Ser. No. 223,948, now U.S. Pat. No. 4,932,029 the disclosure of which is incorporated herein by reference.

The decoders DEC1 and DEC2 perform a signal conversion corresponding to the signal paths in FIGS. 21 to 23. They can be realized by PROMs, gate nets or PAL components. The control signal S2 appears at the output of the decoder DEC and the signal INV appears at the output of the decoder DEC2.

In these Figures, the symbols $P-1, \ldots, 0$ in the crossing lines represent counter states according to the circuitry of FIG. 24, a standard representation for the S1 signal as the output signal of counter Z2. In FIG. 21, two possible modulation states are depicted and the correct signals are necessary for phase correction—signals S2 and INV.

Figure 25:
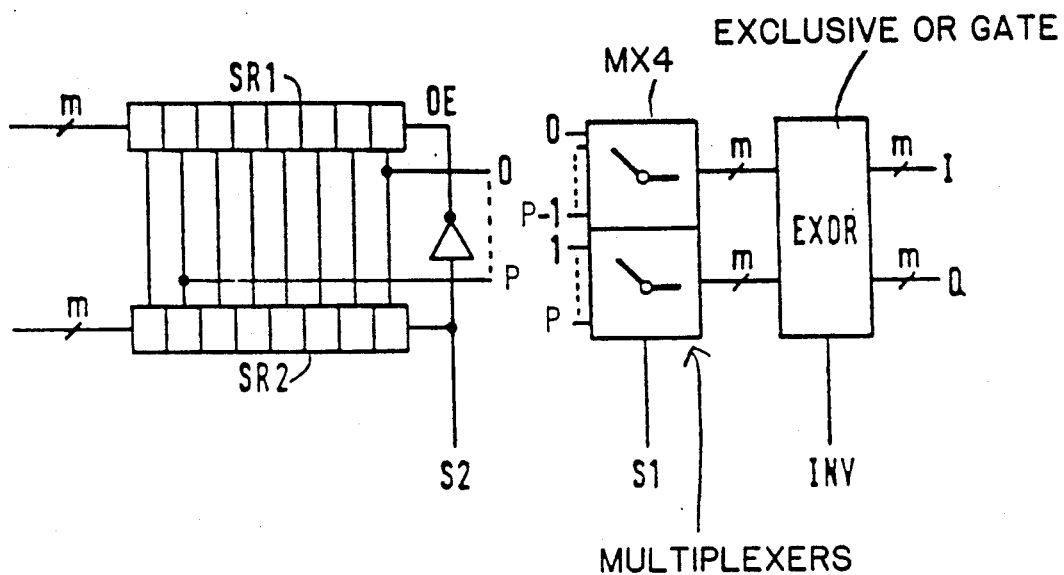
FIG. 25 shows a modification of the shift register bank.

The shift register bank of FIG. 19 can, according to FIG. 25, be simplified in its hardware by the use of the tri-state function of a shift register. The parallel outputs of the shift registers SR1 and SR2 for each channel are connected with each other. The output signals can be taken off from a parallel bus via the parallel connection of the shift registers. Control of the shift registers SR1 and SR2 takes place via the output-enable inputs OE—for SR2 by means of the signal S2 and for SR1 by means of the signal inverted for this purpose. The successive multiplexer MX4 processes the input signals $0 \ldots P-1$ and $1 \ldots P$ in pairs. It is controlled by the signal S1. The exclusive OR gate is constructed the same as in FIG. 19. The following components are required in the realization according to FIG. 19 for m= the number of soft decision bits and n=the number of PSK channels:

m·n·P/8 74 AC 299 components as shift registers,
m·n²·P/16 74 LS 450 components as multiplexers SM11, SM12; SM21, SM22,
m·n (with QPSK, 2m/4) 74 AC 257 components as multiplexers MX33 and
m·n/4 74 F 86 components as exclusive OR gates.

For the realization in accordance with FIG. 25 the following components are required:
m·n P/8 74 AC 299 components as shift registers,
n·m P/16 74 LS 450 components as multiplexers and
m·n/4 74 F 86 components as exclusive OR gates.

Components 74 AC 257, 74 AC 299 and 74 F 86 are manufactured, for example, by Fairchild Industries, and component 74 LS 450 is manufactured, for example, by Texas Instruments.

The multiplexers SM11, SM12, SM21, SM22 have been replaced by the bus function (tri-state of the shift registers) in the embodiment of FIG. 25.

Figure 26:
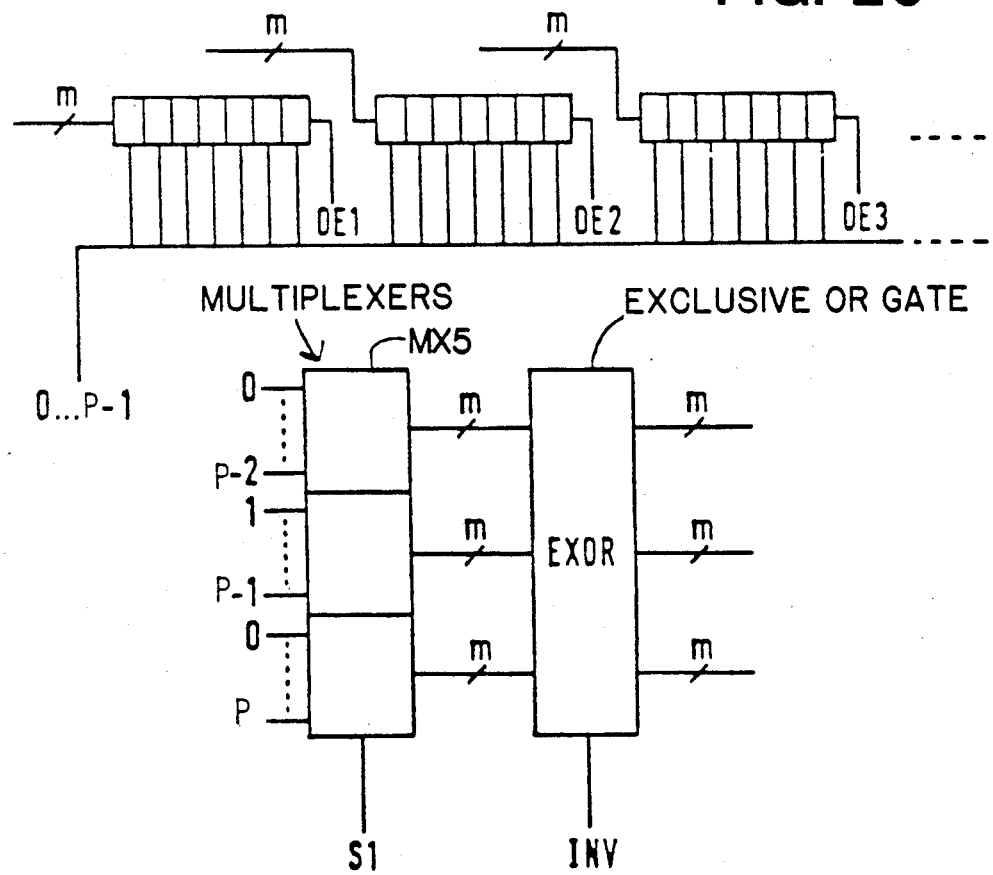
FIG. 26 shows a shift register bank for n-PSK with bus output.

The shift register bank for an n-PSK signal is illustrated in FIG. 26. Again, the output signal can be taken off via a parallel bus of the width $0 \ldots P-1$. The subsequent triple multiplexer MX5 and the switchable exclusive OR gate are again respectively controllable by the control signals S1 and INV.

Figure 27:
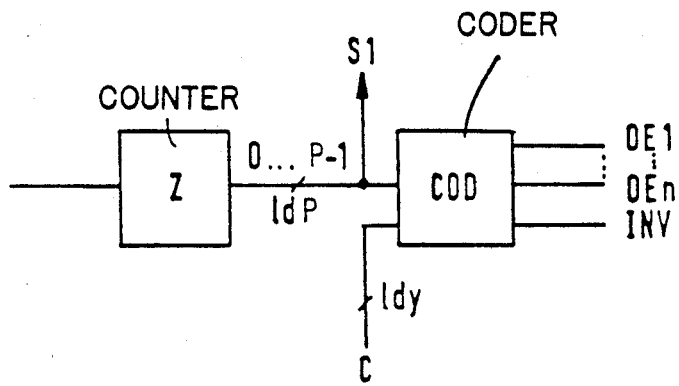
FIG. 27 shows the generation of control signals for n-PSK.
Figure 28:
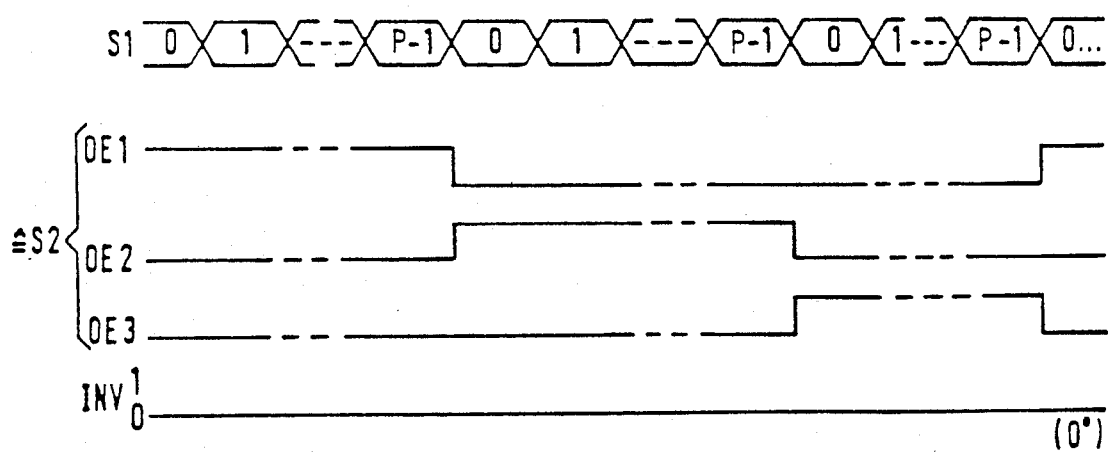
FIG. 28 shows the path of the control signals with n-PSK.

A different output-enable signal OE1, OE2, ... OEn is required for each shift register. The control stage according to FIG. 27 serves to generate the control signals S1, INV and OE1, OE2, ... OEn. A conventional coder COD, designed as PROM or PAL, creates the output-enable signals OE1 ... OEn and the control signal INV from the output signal of the modulo P, counter Z and a control signal C with a bit length of ld y, where y is the number of the possible phase ambiguities. The signal processing in the coder COD is illustrated in FIG. 28 which shows the path of the control signals with n-PSK.

The position of the multiplexer MX33, MX4 and MX5 in relation to the exclusive OR gate (FIGS. 19, 25 and 26) can be switched. This makes particular sense if P<m·n, m being equal to the number of soft decision bits and n being equal to the number of PSK channels. The number of the required components then is only P/4 74 F 86 components, instead of m·n/4 as exclusive OR gates. Component 74 F 86 is manufactured by Fairchild Industries.

The present disclosure relates to the subject matter disclosed in Federal Republic of German Patent Application P 37 24 729.8, filed July 25th, 1987, the entire specification of which is incorporated herein by reference.

It will be understood that the above description of the present invention is susceptible to various modifications, changes and adaptations, and the same are intended to be comprehended within the meaning and range of equivalent of the appended claims.

What is claimed is:

1. In a method for editing a high-rate convolutional code in the form of a plurality of n-output bit streams output for transmission from a convolutional encoder during encoder output periods of the encoder, n being an integer greater than one, and for reconverting the edited code at a receiver, the method including the steps of serially combining and puncturing the plurality of n-output bit streams output from the convolutional encoder during an encoder output period to obtain a punctured code in the form of a serially combined n-output bit stream, and depuncturing the punctured code at the receiver, the improvement wherein each serially combined n-output bit stream is distributed to n transmission channels in respective channel periods of equal length, for each respective transmission channel, only such bit data originating during a time interval of the encoder output period of a length determined by the length of the respective channel period are distributed to said each respective transmission channel during the respective channel period, and the step of de-puncturing comprising the step of de-puncturing the punctured code at the receiver in parallel and simultaneously for all channels.

2. A method as in claim 1, wherein the number of n-output bit streams serially added and punctured during the step of serially adding and puncturing, is equal to n.

3. A device for editing a high-rate convolutional code in the form of a plurality of n-output bit streams output for transmission from a convolutional encoder during encoder output periods of the encoder, n being an integer greater than one, and for reconverting the edited code at a receiver, the device comprising:
   means for serially combining and puncturing the plurality of n-output bit streams output from the convolutional encoder during an encoder output period to obtain a punctured code in the form of a serially combined punctured n-output bit stream, said serially combining and puncturing means including
   n parallel switched data rearrangers, each having parallel inputs for respectively receiving the plurality of n-output bit streams from respective outputs of the convolutional encoder, and
   a rearranger output, said n parallel switched data rearrangers each including a respective conversion means for respectively converting parallel data from the n-output bit streams input thereto to a respective serially combined n-output bit stream,
   control switching circuit means for alternatingly reading in parallel data from the plurality of n-output bit streams corresponding to an encoder output period, into each of said switched data rearrangers via the respective parallel inputs thereof, and continuously reading out serially from each of said switched data rearrangers via the respective rearranger outputs thereof the data from the plurality of n-output bit streams corresponding to an encoder output period as serially combined n-output bit streams, means for distributing each serially combined n-output bit stream to n transmission channels in respective channel periods which are equal, such that for each respective transmission channel, only such bit data originating during a time interval of the encoder output period of a length determined by the length of the respective channel period are distributed to said each respective transmission channel during the respective channel period, and puncturer means for puncturing the serially combined n-output bit streams in the n transmission channels in parallel downstream of said control circuit switching circuit means to obtain punctured bit streams;

means, processing the n transmission channels at the receiver in parallel and simultaneously for all of the n transmission channels, for de-puncturing the punctured bit streams in parallel at the receiver to obtain de-punctured bit streams, said de-puncturing means having an output;

multiplexer means, coupled to the output of said de-puncturing means, for inserting metric-neutral filler data in the de-punctured bit streams;

received data rearrangers at the receiver having an output and having control switching circuit means for continuously reading in serially data from said multiplexer means into said received data rearrangers and alternatingly reading out in parallel from the output of said received data rearrangers data from said received data rearrangers in bit streams corresponding to the encoder output period; and a convolutional decoder corresponding to the convolutional encoder having an input means for receiving the data output from said received data rearrangers.

4. A device as in claim 3, wherein said received data rearrangers each comprise at least two parallel-acting elastic memories for each of the n transmission channels and each of said elastic memories having means for receiving de-punctured received bit streams alternately read thereinto for each transmission channel.

5. A device as in claim 3, wherein said received data rearrangers each comprise a shift register bank having serial inputs for having serially read thereinto de-punctured data parallel outputs, and the device further comprises a parallel bus for serial/parallel conversions in order to combine said parallel outputs of said shift register bank.

6. A device as in claim 3, wherein said received data rearrangers comprise parallel-acting elastic memories, one for each of the n transmission channels and forming parallel/serial converters.

7. A device as in claim 3, further comprising means for inverting the transmitted data for correcting phase ambiguities in the transmitted data, said inverting means being coupled to the output of said received data rearrangers.

8. A device as in claim 3, wherein the plurality of n-output bit streams comprises n n-output bit streams, and the parallel inputs of each switched data rearranger comprises n parallel inputs.

9. A device as in claim 3, wherein said received data rearrangers each comprise a shift register bank having serial inputs for having serially read thereinto de-punctured data and parallel outputs, and a multiplexer for serial/parallel conversion connected to said parallel outputs such that the transmitted data can be read therefrom in the original time sequence.

10. A device as in claim 9, wherein the multiplexers each include n stages, the device further comprising control circuit means for controlling the multiplexers in opposite directions, the register bank having register cells, and with respect to the parallel outputs of the shift register bank, the multiplexers are offset by one register cell such that during read-out of data from the multiplexers dibits are created from time-sequential bits.

11. A device as in claim 3, wherein said switching data rearrangers comprise elastic memories forming parallel/serial converters of said converting means.

12. A device as in claim 11, wherein said received data rearrangers each comprise at least two parallel-acting elastic memories for each of the n transmission channels and each of said elastic memories having means for receiving de-punctured received bit streams alternately read thereinto for each transmission channel.

13. A device as in claim 11, wherein said received data rearrangers each comprise a shift register bank having serial inputs for having serially read thereinto de-punctured data parallel outputs, and the device further comprises a parallel bu for serial/parallel conversions in order to combine said parallel outputs of said shift register bank.

14. A device as in claim 11, wherein said received data rearrangers each comprise a shift register bank having serial inputs for having serially read thereinto de-punctured data and parallel outputs, and a multiplexer for serial/parallel conversion connected to said parallel outputs such that the transmitted data can be read therefrom in the original time sequence.

15. A device as in claim 14, wherein the multiplexers each include n stages, the device further comprising control-circuit means for controlling the multiplexers in opposite directions, the register bank having register cells, and with respect to the parallel outputs of the shift register bank, the multiplexers are offset by one register cell such that during read-out of data from the multiplexers dibits are created from time-sequential bits.

16. A device as in claim 3, wherein said switching data rearrangers comprise parallel-acting elastic memories having parallel outputs and said converting means comprise respective multiplexers coupled to said parallel outputs for performing parallel/serial conversion on data output from said elastic memories via said parallel outputs.

17. A device as in claim 16, wherein said received data rearrangers each comprise at least two parallel-acting elastic memories for each of the n transmission channels and each of said elastic memories having means for receiving de-punctured received bit streams alternately read thereinto for each transmission channel.

18. A device as in claim 16, wherein said received data rearrangers each comprise a shift register bank having serial inputs for having serially read thereinto de-punctured data parallel outputs, and the device further comprises a parallel bus for serial/parallel conversions in order to combine said parallel outputs of said shift register bank.

19. A device as in claim 16, wherein said received data rearrangers each comprise a shift register bank having serial inputs for having serially read thereinto de-punctured data and parallel outputs, and a multiplexer for serial/parallel conversion connected to said parallel outputs such that the transmitted data can be read therefrom in the original time sequence.

20. A device as in claim 19, wherein the multiplexers each include n stages, the device further comprising control circuit means for controlling the multiplexers in opposite directions, the register bank having register cells, and with respect to the parallel outputs of the shift register bank, the multiplexers are offset by one register cell such that during read-out of data from the multiplexers dibits are created from time-sequential bits.

21. A device as in claim 3, further comprising a channel transposition stage for correcting phase ambiguities in the transmitted data downstream of said de-puncturing means.

22. A device as in claim 21, wherein said channel transposition stage is coupled to the output of said received data rearrangers.

23. A device as in claim 21, wherein said channel transposition stage comprises means for inverting the transmitted data, said inverting means being coupled to the output of said received data rearrangers.

24. A device as in claim 21, wherein said channel transposition stage comprises a logical exclusive OR linking stage actuable via a control signal.

25. A device as in claim 24, wherein said channel transposition stage is coupled to the output of said received data rearrangers.

* * * * *